United States Patent [19]

Merenda et al.

[11] Patent Number: 4,826,786

[45] Date of Patent: May 2, 1989

[54] METHOD FOR FORMING A MULTILAYERED METAL NETWORK FOR BONDING COMPONENTS OF A HIGH-DENSITY INTEGRATED CIRCUIT, AND INTEGRATED CIRCUIT PRODUCED THEREBY

[75] Inventors: Pierre Merenda, Aix En Provence; Philippe Chantraine, Neuilly Sur Seine; Daniel Lambert, Juvisy Sur Orge, all of France

[73] Assignee: Bull, S.A., Paris, France

[21] Appl. No.: 914,356

[22] Filed: Oct. 2, 1986

[30] Foreign Application Priority Data

Oct. 3, 1985 [FR] France .................................. 85 14670

[51] Int. Cl.$^4$ ................... H01L 21/283; H01L 21/316
[52] U.S. Cl. ...................................... 437/195; 437/231
[58] Field of Search ............... 156/643, 646, 653, 656; 357/71, 54; 437/195, 231

[56] References Cited

U.S. PATENT DOCUMENTS

| | | | |
|---|---|---|---|
| 3,506,880 | 4/1970 | Langdoa et al. ..................... | 317/101 |
| 3,542,550 | 11/1970 | Conrad et al. ......................... | 96/34 |
| 4,222,792 | 9/1980 | Lever et al. ..................... | 156/643 X |
| 4,481,070 | 11/1984 | Thomas et al. ..................... | 156/643 |
| 4,519,872 | 5/1985 | Anderson, Jr. et al. ............ | 156/643 |
| 4,523,975 | 6/1985 | Groves et al. ........................ | 156/643 |
| 4,541,169 | 9/1985 | Bartush .................................. | 29/591 |
| 4,654,113 | 3/1987 | Tuchiya et al. ....................... | 156/643 |
| 4,662,064 | 5/1987 | Hsu et al. .............................. | 29/591 |

FOREIGN PATENT DOCUMENTS

| | | |
|---|---|---|
| 0025261 | 3/1981 | European Pat. Off. . |
| 0071010 | 2/1983 | European Pat. Off. . |
| 0147203 | 7/1985 | European Pat. Off. . |
| 0197827 | 11/1983 | Japan ................................... 437/231 |
| 0066147 | 4/1984 | Japan ................................... 437/195 |

OTHER PUBLICATIONS

Saia et al., J. Electrochem. Soc.: Solid-State Science and Technology, (Aug. 1985), pp. 1954–1957.

*Primary Examiner*—Olik Chaudhuri
*Attorney, Agent, or Firm*—Kerkam, Stowell, Kondracki & Clarke

[57] ABSTRACT

A method of forming a planarization layer over a multilayered metal network which interconnects the components of a high-density integrated circuit and which includes conductors having steep edges disposed over a substrate. A layer of spin-on-glass is applied over the lower metal layer so as to have a thickness substantially equal to that of the lower metal layer and to form a thin film over the conductors. The spin-on-glass layer is uniformly etched to expose the upper surfaces of the conductors, and a dielectric layer is applied onto the etched spin-on-glass layer and upper surfaces of the conductors.

9 Claims, 3 Drawing Sheets

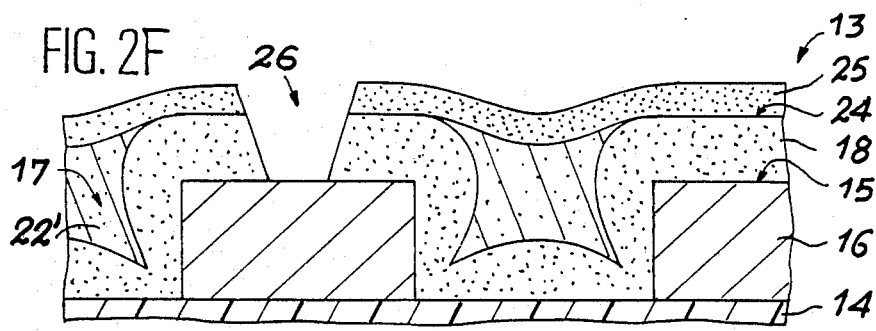
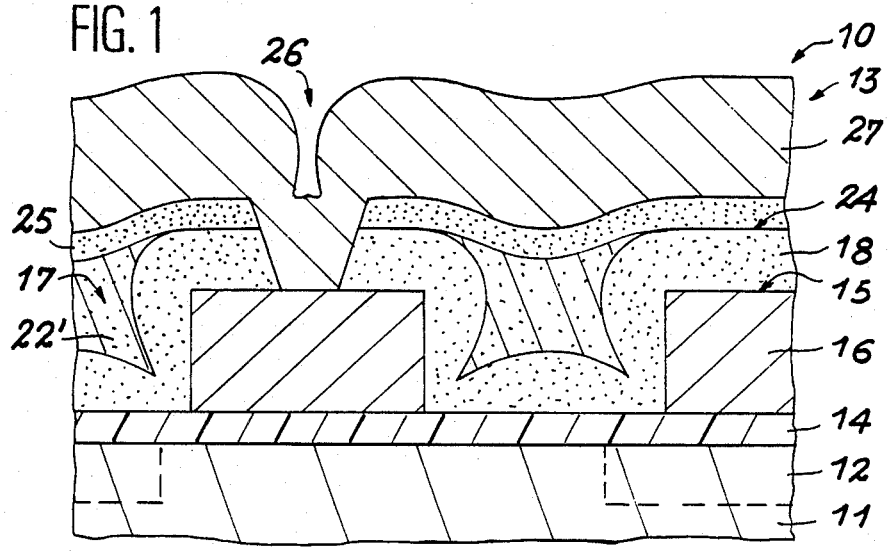
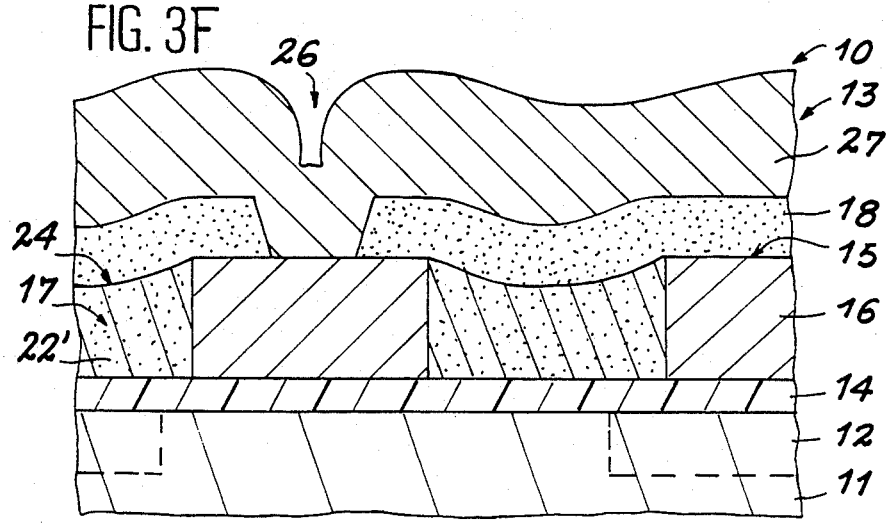

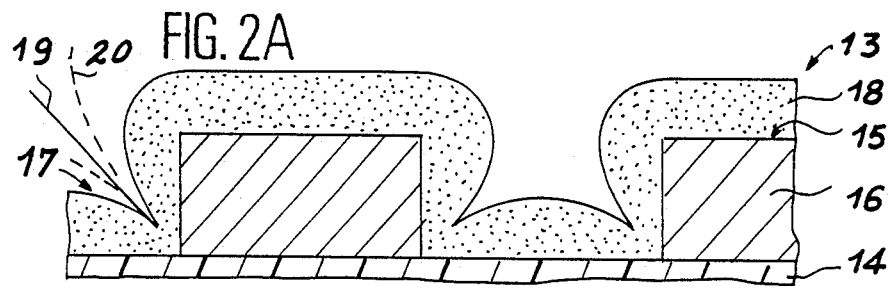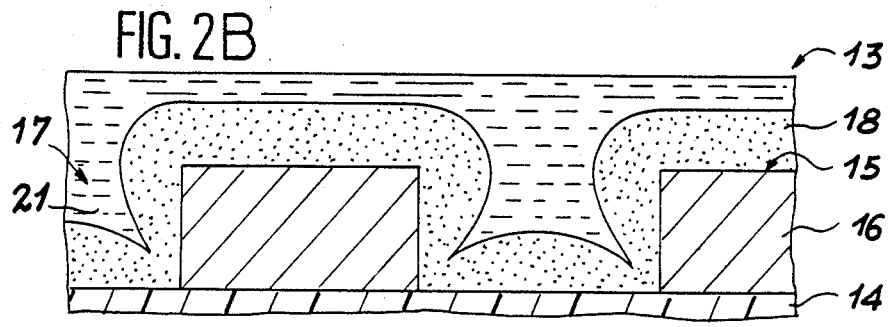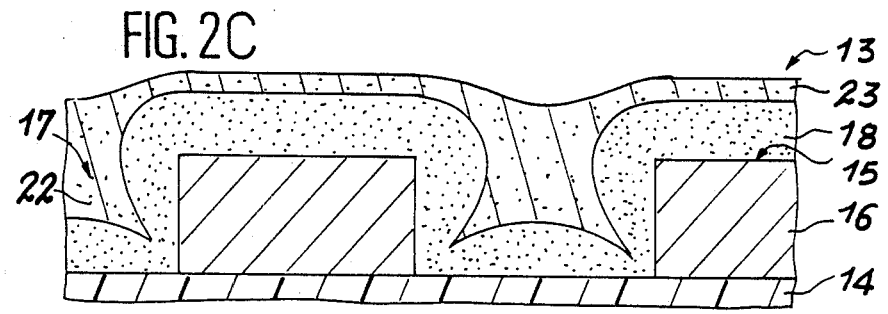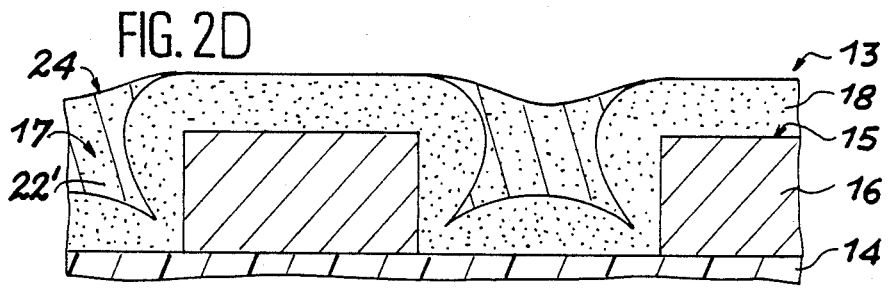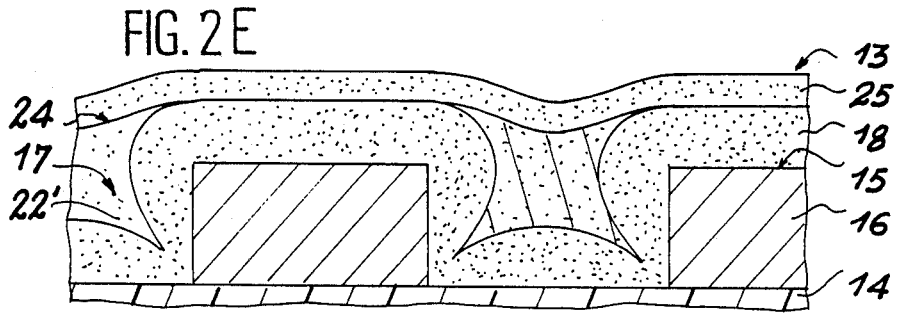

METHOD FOR FORMING A MULTILAYERED METAL NETWORK FOR BONDING COMPONENTS OF A HIGH-DENSITY INTEGRATED CIRCUIT, AND INTEGRATED CIRCUIT PRODUCED THEREBY

The invention relates to a method for forming a multi-layered metal network for bonding components of a high-density integrated circuit, as well as an integrated circuit produced thereby, which is currently known as a VLSI chip (for very large scale integration).

Conventional methods for forming a multilayered network for bonding components of a chip substantially comprise forming a metal film on a dielectric layer that covers a lower metal layer comprising conductors. At the present time, the conductive layers are ordinarily of aluminum and have a thickness in the micrometer range.

Initially, the thickness of the lower metal layer is uniform and covers a base surface that extends above the components of the chip. the conductors are ordinarily etched, by placing the lower metal layer in reactive plasma. This etching is practically anisotropic. It is done in the direction of the thickness of the layer and thus imparts an approximately rectangular section to the conductors. At present, the typical spacing of the metal conductors is 6 micrometers (6 $\mu$m), for a width of 3 $\mu$m, and a reduction of these dimensions is desirable.

The etched layer is then covered with a dielectric layer, which is ordinarily produced by chemical deposition of silicon dioxide ($SiO_2$) in the vapor phase. Typically, this layer has a thickness on the order of 0.8 $\mu$m. It is desirable for the dielectric layer to have a uniform thickness over the entire lower metal layer, so as to assure satisfactory and uniform electrical insulation between the two metal layers.

Next, contact openings are made (called vias) through the dielectric layer for bonding between the conductors and the upper metal layer. This upper metal layer is disposed on the dielectric layer and in its openings, and is then etched so as to form conductors, in a manner analogous to that for the lower layer.

At present, this technique presents serious problems, which are prejudicial to the desired density of the bonding network and are substantially caused by the abrupt front edges of the conductors of the lower layer. Instead of obtaining a dielectric layer of uniform thickness, experience has shown that the dielectric shrinks in the angles formed by the conductors with their base surface in a plane perpendicular to the conductors. More specifically, the thickness of the dielectric layer decreases progressively toward the top of each base angle, at a tangent to a straight line that approximately corresponds to the bisector of the angle and will hereinafter be called the bisector, for convenience. Of itself, this layer already has the disadvantage that in the base angles it provides defective insulation between the metal layers.

In practice, the major problem is presented by the deposition of the upper conductive layer on the dielectric layer, since as will be appreciated the defects in the covering provided by the dielectric layer are amplified considerably thereby. In fact, experience has shown that there is a very pronounced thinning of the conductive layer, at a tangent to the bisector of the base angles. The metal layer, viewed in each base angle and in a plane that is normal to the conductors, takes the form of two adjacent lips, which are at a tangent to the plane bisecting the base angle. The thinning that prevails at the junction of the lips creates an undesirable electrical resistance, which the layer accumulates in all of its base angles.

This advantage is made still worse if the base surface of the conductors is not flat and if it covers bulges that are approximately right angles. This is the case, for example, if the lower conductive layer is metal and covers another conductive layer that is of polycrystalline silicon or of metal. In that case, two conductors can be superimposed and can create a more accentuated undulation, which is reflected in a more extended and more accentuated thinning of the conductive layer along vertical walls, and consequently in a defective electrical connection with the adjoining portion of the base. In all cases, the conductors of the upper layer will accordingly have an appreciable succession of resistances in all its base angles and so will be of questionable reliability.

The solution presently used for overcoming this serious disadvantage has been to provide conductive micrograins between the lips of the upper conductive layer in each base angle. Nevertheless, it is clear that the efficacy of these micrograins is often inadequate. Furthermore, even if they do prove adequate, the undulation of the lower layer presents another problem in terms of the etching of the upper conductive layer. This etching is again preferably done in reactive plasma, its duration determined by the thickness of the layer that is to be etched. Since the etching in reactive plasma is anisotropic and is normally done in the general plane of the chip, the duration of the etching is determined by the thickness of the conductive layer along this direction. At the steep edges, it is found that the thickness of the conductive layer along this direction may attain twice the value of the thickness in other portions of the layer, which determine the etching time. Thus the etching must be performed until conductive portions on the steep edges of the dielectric layer are completely removed, so as to assure perfect electrical insulation between adjacent conductors. However, extending the duration of the etching substantially affects the quality.

Furthermore, the shape of the lip that forms on the dielectric layer on the abrupt edges of the lower conductive layer presents a particularly important, and practically insoluble, problem in terms of etching the upper conductive layer. In fact, the apex of the lip on the dielectric layer casts a shadow in the reactive plasma and so screens the metal portion located in that zone. Etching proves to be imperfect, leaving residual conductive portions, with adverse and often intolerable consequences (such as the risk of short-circuiting, etc.).

One solution for all these problems, which is presented in a related patent application by the present applicant, is to provide a planar supporting surface for the upper multilayered metal layer. More specifically, the method of forming a metal network for bonding the components of a high-density integrated circuit, including the formation of a metal layer on a dielectric layer that covers a lower metal layer including conductors having steep edges, comprises first, before forming the upper metal layer, approximately filling up the hollows between the intervals between the conductors, by spreading a viscous dielectric suspension, and then annealing this suspension.

This method may be performed in two ways, that is, the dielectric suspension may be used before or after the dielectric layer is formed.

First, the deposition of the dielectric suspension is provided over the entire lower metal layer, before the dielectric layer is formed by chemical deposition. The suspension then at least partially fills the intervals between the conductors and because of its viscosity it spreads out in the form of a thin film over the upper surfaces of the conductors. Annealing the suspension causes the dielectric to be deposited and fixed in a form that is less compact than and has a different structure from that of the dielectric layer. This latter is ordinarily formed by chemical deposition in the vapor phase and uniformly covers the dielectric of the annealed suspension. Naturally it may be formed in any other manner instead. However, if the two dielectrics have different properties, this will present some problems in applying the intended method.

For one thind, the dielectric of the annealed suspension ordinarily has a lower electrical resistance than the dielectric that is deposited chemically. Its poorer electrical insulation limits the desired close proximity of the conductors to one another. High-density conductors cannot be obtained except with special suspensions or under particular conditions, which are notably more expensive.

Furthermore, to connect the metal layers to one another, contact openings are made through the dielectric layer and the thin dielectric film that covers the conductors of the lower layer. The openings are typically etched with reactive plasma, which has a greater speed of attack for the dielectric of the annealed suspension. Standard etching would then create steep edges, similar to those of the conductors (16), and would result in the same phenomenon of shrinkage of the upper metal layer in the base angles of the openings. To avoid this shrinkage, a standard variant of the etching is used, which flares the openings and thus makes their angles quite obtuse. Nevertheless, because of this superposition of the dielectric layer on the dielectric film, the speeds of attack being different in the two, it is difficult to master this variant. Accordingly, overexposure accordingly becomes necessary, which magnifies the effect of the lateral components, which is normally weak in etching in reactive plasma. The result is different flaring in the film and in the layer, so that each opening comes to have a profile of two coaxial frustoconical portions superimposed on one another. Meanwhile, the portion that is flared to the greater extent is relative to the film, and consequently it results in overhanging edges of the upper dielectric layer. Even a slight overhang already makes it difficult to apply the upper metal layer, and the result is a shrinkage phenomenon similar to that described above. A relatively pronounced overhang often leads to gaps, or poor continuity of the upper metal layer at the level of the openings. To overcome this disadvantage, the openings must be etched by a very complicated and more-expensive method.

In addition, before forming the upper conductive layer, it is ordinarily indispensable for its entire supporting surface to be exposed briefly to a cleaning solution. Once again, the chemically deposited dielectric proves to be more resistant to the attack of cleaning solutions. In practice, the thin film is attacked enough that parts of the dielectric layer adjacent to the openings protrude. This further exacerbates the above-described disadvantage, and thus precludes using the standard methods for forming the upper metal layer.

To overcome these disadvantages, European Pat. No. 0,025,261 describes a method comprising etching conductors in a metal layer by means of a layer of photoresistive resin, leaving the layer of resin on the conductors, depositing and annealing a viscous dielectric suspension to form a uniform dielectric layer, heating the integrated circuit to a high temperature to deform the resin layer and effect a separation between the portions of the dielectric layer that are supported by the resin and the portions remaining between the conductors, chemically removing the resin layer and the portions of the dielectric layer supported by the resin to expose the upper surface of the conductors, depositing a second dielectric layer on the conductors and on the resultant portions of the dielectric layer by a different method, and making openings in the second dielectric layer above the conductors.

This method, known as the lift-off method, adds two delicate steps to the manufacture of the bonding network of an integrated circuit. First, exposing the integrated circuit to a high temperature, on the order of 500° C., may be prejudicial to the proper functioning of the components incorporated in the integrated circuit. Also, it causes organic products contained in the resin to decompose, so that the residues stick to the conductors. Second, the separation between the portions of the first dielectric layer that are supported by the resin and the resultant portions is effected along an uncontrollable profile, thereby resulting in abrupt edges and producing the above-described defects in the second dielectric layer. Also, this earlier method necessitates chemical removal of the resin layer. The solvent thus also comes into contact with the remaining portions of the first dielectric layer, which have just been heated strongly. Thus this method adds the step of using oxygen plasma to remove the residues of the resin layer that are sticking to the conductors.

The second way of performing the improved method comprises depositing the dielectric suspension after forming a dielectric layer by chemical deposition on the lower metal layer. As compared with the above way, this has the advantage, first, of solving the problem of insulation between the conductors, because of its greater electrical resistance, and thus enabling a substantial increase in the density of the conductors, down to a spacing of less than 4 $\mu$m. It also has the advantage of depositing onto the dielectric layer the thin films that result from the annealing of the dielectric suspension. The more-accentuated flaring of each opening does not cause an overhang on the part of the lower layer and contrarily promotes the deposition of the upper layer. Nevertheless, before this metal layer is deposited it is located in direct contact, over its entire surface, with the cleaning solutions. In practice, it is found that substantial removal of the dielectric of the annealed suspension takes place, so that most of the advantages of the proposed method are then lost.

The present invention overcomes the disadvantages of the two ways of performing the improved method described above.

According to the invention, the method of forming a multilayered metal network for bonding the components of a high-density integrated circuit, comprising forming a lower metal layer that includes conductors having steep edges, covering the lower metal layer with two superimposed dielectric layers, one being obtained by annealing a viscous dielectric suspension and the other by a different method, removing from the dielectric layer obtained by annealing the entire thickness of the portions located above the conductors, making openings in said other dielectric layer above the conductors, and forming an upper metal layer, is characterized in that the removal of the dielectric layer obtained by annealing is performed over the entirety of this layer along said thickness of the portions, regardless of the order in which the two dielectric layers were formed.

The invention also relates to the high-density integrated circuit produced by this method.

The characteristics and advantages of the invention will become apparent from the ensuing description, which is provided by way of non-limiting example, taken in conjunction with the accompanying drawings.

BRIEF DESCRIPTION OF THE DRAWINGS

FIG. 1 is a fragmentary cross-sectional view of a high-density integrated circuit according to the invention;

FIGS. 2A-2F are views analogous to those of FIG. 1, illustrating the essential steps of the method according to the invention for obtaining the integrated circuit shown in FIG. 1; and FIGS. 3A-3F are views analogous to those of FIGS. 1 and 2A-2F, illustrating the essential steps of a variant of the method and of the integrated circuit according to the invention.

Figure 3A:
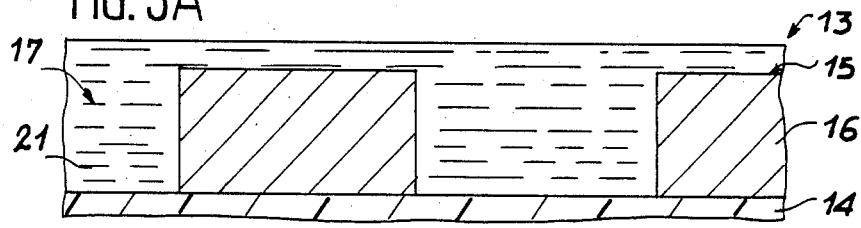
Figure 3B:
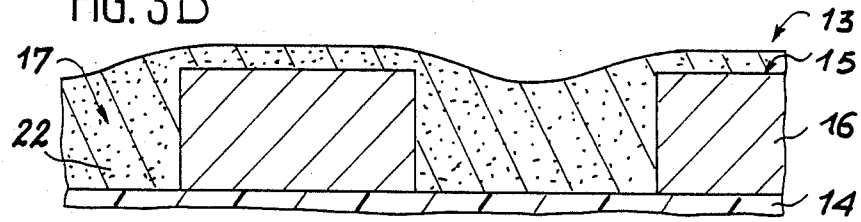

The high-density integrated circuit 10 shown in FIG. 1 comprises a semiconductor substrate 11 that incorporates a set of components 12 shown in schematic form, and a metal network 13 for bonding the components 12 of the substrate 11. The network 13 generally has as its base surface the upper surface of an insulating layer 14 that covers the substrate 11. In MOS (metal oxide semiconductor) technology, the metal layer 13 often covers a primary layer of bonding conductors made of polycrystalline silicon. Since polycrystalline conductors do not present the problems the invention is intended to overcome, these conductors are not shown in FIG. 1, but it will be understood that an integrated circuit according to the invention may include such conductors. The bonding network 13 of the integrated circuit 10 shown in FIG. 1 will now be described, in terms of the method for manufacturing it that is shown in FIGS. 2A-2F.

Referring to FIGS. 1 and 2A, the bonding network 13 first, in the standard manner, includes a lower conductive layer 15 that covers the upper surface of the insulating layer 14. The layer 15 comprises metal conductors 16 separated by intervals 17. The conductors 16 are generally parallel to one another, in the direction perpendicular to the plane of the drawings, and have a substantially rectangular section. This section is due to the etching, in reactive plasma, of a first metal layer that uniformly covers the insulating layer 14. Certain variants of this etching make it possible to obtain edges that are less steep, but they nevertheless present the same problems as those associated with vertical faces. The expression "conductors having steep edges" must accordingly be understood as including all conductors in which the slope of their edges present the same problems as those discussed above and illustrated hereinafter.

Also in the standard manner, a dielectric layer 18 is deposited over the entire lower layer 15. Experience has shown that shrinkage of the dielectric layer 18 occurs in the base angles of the layer 15, that is, the angles that the conductors 16 form with the insulating layer 14. It is ordinarily made of mineral silicon dioxide, chemically deposited in the vapor phase. As illustrated, this shrinkage lends the layer of lip-shaped profile, which in the plane of the drawings converges at a tangent to a straight line 19 that corresponds approximately to the bisector of each angle. This phenomenon is due to the steep edges of the conductors and occurs regardless of the manner in which the layer 18 is deposited.

The sequence of the standard method was to deposit a metal film over the dielectric layer 18. In this case, the profile of this layer in the base angles will be that represented with dash lines 20 in FIG. 2A. As shown, the shrinkage of such a layer is notably more pronounced than that of the layer 18. The method according to the invention overcomes this disadvantage.

Generally, the invention comprises at least partially filling up the hollows that exist in the intervals 17 between the conductors 16, such as to provide the upper metal layer with a roughly planar base surface. To achieve this, a viscous dielectric suspension 21 is deposited on the integrated circuit 10, then spread uniformly over the entire surface of the dielectric layer 18. In FIG. 2B, the suspension 21 has been provided in a quantity sufficient to overflow the hollows formed by the dielectric layer 18 in the intervals 17. The spreading is preferably obtained by causing the semiconductor wafer, including the integrated circuit 10, to rotate at a speed determined in such a manner that the centrifugal force comes to balance the forces of viscosity of the suspension. For example, the suspension may be a mineral-silica-based gel, advantageously in colloidal form, such as that presently known as S.O.G. (spin-on glass) and well known in the art. In this case, the viscous dielectric suspension is used in the same manner as the photo-sensitive resins used for the configuration of the elements of the integrated circuit. Now proceeding to anneal the suspension 21, the solvent of the suspension evaporates while the dielectric forms a compact mass 22, such as that shown in FIG. 2C. The mass 22 is substantially localized in the intervals 17, but in the form of a thin film 23 it also covers the dielectric layer 18 located above the conductors 16. It should be noted that the films 23 will always be present, no matter what the degree of filling of the hollows in the intervals 17, because of the viscosity of the suspension 21 and its spreading. In FIG. 2D, the entire dielectric mass 22 has been placed in reactive plasma, so as to remove a film of uniform thickness, substantially corresponding to the thickness of the films 23. The result is a new surface 24, comprising exposed upper surfaces of the dielctric layer 18 located above the conductors 16, and the remaining upper surfaces 22' of the dielectric mass. Since the object is to expose the upper surfaces of the dielectric layer 18 located above the conductors 16, the etching in reactive plasma need be done only to their level. In fact, by exposing them it is possible to make the contact openings without encountering two types of dielectric. However, if cleaning of the new surface 24 provided with its openings should prove to be necessary, the cleaning product would attack the remaining mass 22', and the advantages sought by the invention would be lost. This is why, as shown in FIG. 2E, the new surface 24 is covered with a second dielectric layer 25 having a uniform thickness and made of a material that is resistant to the cleaning product. Advantageously, it is made in the same manner as the dielectric layer, that is, of mineral silicon dioxide chemically deposited in the vapor phase. The advantage is thus that there is a homogeneous dielectric thickness above the conductor 16, which facilitates etching contact openings 26. In FIG. 2F, the contact openings 26 are made above the conductors 16 so as to connect them to the upper metal layer that will be deposited later. In the standard manner, the openings 26 are also etched in reactive plasma.

The deposition of the upper metal layer 27 results in the configuration shown in FIG. 1. Naturally the layer 27 may later serve as a lower layer, so that the method according to the invention can also be used for forming a network 13 for bonding three metal layers as well.

Figure 3C:
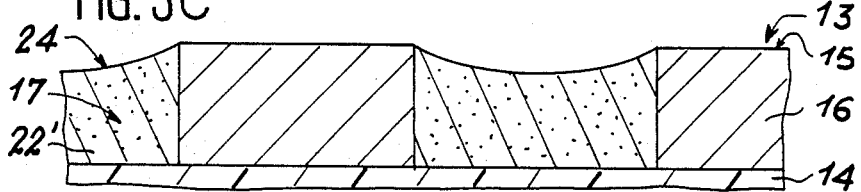
Figure 3D:
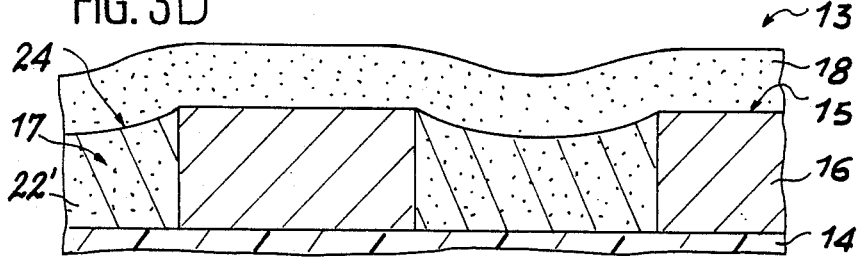
Figure 3E:
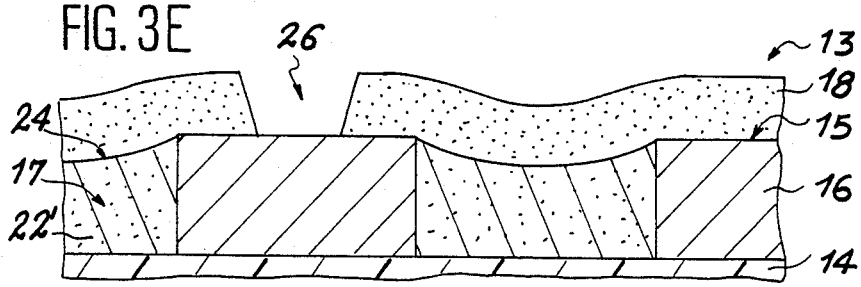

FIGS. 3A–3F illustrate a variant way of performing the method according to the invention and the resultant integrated circuit. For easier reading, the same reference numerals as in FIGS. 1 and 2 are assigned to the same elements shown in FIGS. 3A–3F. In FIG. 3A, the dielectric suspension 21 is first applied to the entire lower layer 15 comprising conductors 16 and the intervals 17 between them. This example, as in FIG. 2B, shows the particular case where the suspension fills and overflows the intervals 17 so as to form a sheet having a uniform surface. Annealing the suspension 21 leads to the formation of a compact dielectric mass 22 that approximately fills up the intervals 17 and covers each conductor 16 with a thin film 23. In FIG. 3C, as in FIG. 2D, the entire dielectric mass 22 has been placed in reactive plasma, for uniformly removing a film the thickness of which corresponds substantially to the thickness of the film 23. The result is a new surface 24 comprising the upper exposed surfaces of the conductors 16 and the upper surfaces of the remaining dielectric mass 22'. Since the object is to expose the conductors 16 so as to avoid the presence of two varieties of dielectric when the contact openings are etched, the etching in reactive plasma for effecting this exposure may be limited to the films 23. Next (FIG. 3D), the dielectric layer 18 is deposited, in the same manner as before. In FIG. 3E, the contact openings 26 have been etched above the conductors 16 so as to connect them to the upper layer. As the drawing shows, each opening 26 is now formed by a single frustoconical portion. In FIG. 3F, the upper metal layer 27 has been deposited in the same manner as in FIG. 1.

We claim:

1. In a method of forming a multilayered metal network for interconnecting components of a high-density integrated circuit, the network comprising a lower metal layer including conductors having steep edges formed over a substrate, a method of obtaining a planar surface over said lower metal layer comprising applying a layer of spin-on-glass over said lower metal layer, said spin-on-glass layer being applied to have a thickness substantially equal to that of the lower metal layer and to form a thin film over said conductors; uniformly etching said spin-on-glass layer to expose upper surfaces of said conductors of the lower metal layer; and applying a dielectric layer onto the etched spin-on-glass layer and said upper surfaces of the conductors.

2. The method of claim 1, wherein said spin-on-glass layer comprises a mineral-silica-based gel in colloidal form.

3. The method of claim 1, wherein said step of applying the spin-on-glass layer comprises spreading a viscous suspension of spin-on-glass onto said lower metal layer, and annealing the suspension.

4. The method of claim 1, wherein said etching step comprises etching said spin-on-glass layer using reactive plasma etching.

5. The method of claim 1, wherein said step of applying the dielectric layer comprises applying a layer of silicon dioxide using chemical vapor deposition.

6. The method of claim 1 further comprising forming vias through said dielectric layer to expose portions of said upper surfaces of the conductors of said lower metal layer.

7. The method of claim 6, wherein said step of forming vias comprises employing a reactive plasma etch process and controlling the process to flare the vias and to provide the vias with a frusto-conical shape.

8. The method of claim 7 further comprising covering said dielectric layer while filling said vias with an upper metal layer.

9. A method of forming a multilayered metal network for interconnecting components of a highdensity integrated circuit, comprising forming over a substrate a lower metal layer including conductors having steep edges; spreading a layer of spin-on-glass in the form of a viscous suspension of silicon dioxide on said lower metal layer; annealing said spin-on-glass layer, said spin-on-glass layer having a thickness substantially equal to said conductors; uniformly etching using a reactive plasma etch process said spin-on-glass layer to expose upper surfaces of said conductors of the lower metal layer; applying using chemical vapor deposition a dielectric layer of silicon dioxide over the etched spin-on-glass layer and the exposed upper surfaces of the conductors of the lower metal layer; forming vias through said dielectric layer by using a reactive plasma etch process so as to flare said vias and provide the vias with a frusto-conical shape for exposing portions of said upper surfaces of said conductors; and covering said dielectric layer while filling said vias with an upper metal layer.

* * * * *

UNITED STATES PATENT AND TRADEMARK OFFICE
CERTIFICATE OF CORRECTION

PATENT NO. : 4,826,786

DATED : May 2, 1989

INVENTOR(S) : MERENDA

It is certified that error appears in the above-identified patent and that said Letters Patent is hereby corrected as shown below:

In Col. 8, line 39, line 8, (Claim 9), after "equal to" insert --that of the lower metal layer and forming a thin film over--.

Signed and Sealed this

Twenty-sixth Day of June, 1990

Attest:

HARRY F. MANBECK, JR.

*Attesting Officer*     *Commissioner of Patents and Trademarks*